United States Patent [19]

Garbacz et al.

[11] Patent Number: 4,764,701
[45] Date of Patent: Aug. 16, 1988

[54] MULTICHANNEL SURFACE ACOUSTIC WAVE ENCODER/DECODER

[75] Inventors: Michael J. Garbacz, Norridge; Kai Hansen, Arlington Heights, both of Ill.

[73] Assignee: Zenith Electronics Corporation, Glenview, Ill.

[21] Appl. No.: 947,655

[22] Filed: Dec. 30, 1986

[51] Int. Cl.$^4$ .......................................... H01L 41/08
[52] U.S. Cl. ................... 310/313 R; 310/313 B; 310/313 R; 310/313 D; 333/151; 333/194
[58] Field of Search ................ 310/313; 333/150–155, 333/193–196

[56] References Cited

U.S. PATENT DOCUMENTS

| | | | |
|---|---|---|---|
| 3,803,395 | 4/1974 | Quate | 310/313 B X |
| 3,810,257 | 5/1974 | Jones et al. | 333/151 |
| 3,898,592 | 8/1975 | Solie | 310/313 C X |
| 3,983,517 | 9/1976 | Weglein | 310/313 D X |
| 4,405,874 | 9/1983 | Suthers | 333/151 X |
| 4,434,383 | 2/1984 | Cho et al. | 310/313 D X |
| 4,499,393 | 2/1985 | Stokes et al. | 333/154 X |
| 4,539,502 | 9/1985 | Este et al. | 333/151 X |
| 4,625,208 | 11/1986 | Skeie et al. | 333/154 X |
| 4,697,115 | 9/1987 | Mitsutsuka | 310/313 D X |

FOREIGN PATENT DOCUMENTS 509977 9/1976 U.S.S.R. .......................... 310/313 R

Primary Examiner—Mark O. Budd

[57] ABSTRACT

A multichannel surface acoustic wave encoder/decoder having a common electrical input is designed so that the insertion losses of the channels differ despite the apparent design constraint of closely matched channel output impedances. The input transducing device or SAW transmitter is divided into individual transducers (or into subtransducers) having different numbers of finger overlaps, thus achieving different acoustic output levels which in turn result in different insertion losses for different channels. The finger spacing of the SAW transmitters can differ between the respective input transducers or subtransducers so as to optimize the center frequency of each channel.

19 Claims, 7 Drawing Sheets

MULTICHANNEL SURFACE ACOUSTIC WAVE ENCODER/DECODER

This invention relates to improvements in surface acoustic wave (SAW) devices. It is particularly directed to SAW devices for encoding and decoding scrambled broadcasts in the subscription television industry.

BACKGROUND OF THE INVENTION

Surface acoustic wave (SAW) devices are used as delay lines and band-pass filters in a variety of applications. Recently they have been employed in encoding and decoding circuits for subscription TV systems of the type described in copending U.S. patent application Ser. No. 711,947, filed on March 15, 1985.

An encoder SAW device with a plurality of electrical bandpass filter channels is used there to introduce frequency-dependent amplitude and phase distortion into the video output of a TV transmitter, as a means of encoding the video signal and making it unintelligible to receivers which are not equipped with suitable decoders. For additional encoding, the transmitter output is switched in an unpredictable way between alternative SAW filter channels having different frequency response characteristics.

At the TV receiver a decoder SAW device unscrambles the video signal by passing it through corresponding SAW channels which have frequency characteristics complementary to those of the SAW channels in the transmitter. The decoder has a switching circuit which selects the proper SAW channel to match the encoder. This switching circuit takes its switching control input from the video signal, after processing by still another SAW channel.

In an encoder/decoder of this type, all of the SAW channels must be matched to each other with respect to delay time and various other electrical characteristics. This need for electrical matching creates certain problems, which it is the object of the present invention to solve.

Matching the electrical characteristics of the encoder/decoder SAW channels requires the designer to meet several seemingly contradictory criteria. On one hand, the output impedances of these SAW channels must match each other closely, or the performance of the scrambling/unscrambling system will be quite sensitive to variations of the electrical characteristics of other components of the system. For example, if the output impedances are not closely matched, the decoded TV picture noticeably deteriorates as the output is switched from one alternative channel to another. To avoid such picture deterioration, the other system components must then be subjected to unacceptably high tolerance requirements. On the other hand, there must be significant insertion loss differences between the channels or they will not differ in their frequency response characteristics as required by their encoding/decoding function. These insertion losses, however, must be kept at an overall minimum in order to avoid degrading the quality of TV reception.

Each of the SAW channels is of the type having a uniform interdigital input SAW transducer (or acoustic transmitter) and an apodized output interdigital SAW transducer (or accustic receiver) which are acoustically coupled to each other. All the SAW channels of a given enccder/decoder conventionally are mounted upon a common piezoelectric substrate, and share a common input transducer. But they have individual output transducers (one for each SAW channel), and these output transducers have different apodization envelopes in order to achieve the different frequency response characteristics required for a subscription TV encoding/decoding system.

For a given input transducer, both the insertion loss and the output impedance of each SAW channel are approximately inversely proportional to the same parameter, i.e. to the aperture of its apodized output transducer. Thus, if the SAW channels are to have closely matching output impedances, their respective output transducers must all have the same aperture width, whereas the aperture widths of the output transducers must be different if the SAW channels are to have specified different insertion losses. Both requirements evidently cannot be met at the same time, so long as each SAW channel shares a common input transducer which has the same acoustical coupling characteristics relative to the respective output transducers of each SAW channel.

It has now been discovered, however, that these conflicting design requirements can be met if the SAW channels are provided with different input transducers, or at least with common input transducer which presents different acoustical coupling characterstics to the output transducers of different SAW channels.

The amplitude of the acoustic signal transmitted from a uniform input transducer of the interdigital type is proportional to the number of overlaps between its electrically oppositely poled digits (fingers). By providing a distinct input transducer for each channel, the amplitude of the acoustic signal transmitted from the input transducer of each channel can be made different from that of the others by selecting a different number of finger overlaps for each distinct transducer. To make the input transducers distinct, each can be a separate uniform transducer component with its electrical input terminals connected in parallel with the others. Or better yet, these input transducers can be combined into a common structure which couples differently to each channel.

By transmitting different acoustic signal strengths to each of the output transducers, the output signal levels of the various output transducers can be modified independently of their output impedances. This permits the insertion loss of each channel to be chosen largely independently of the channel's output impedance.

By means of this technique, the output impedances of the output transducers can be matched even if the insertion losses of the individual channels differ significantly. This avoids the problem of signal distortion as the subscription TV encoder/decoder switches between SAW channels.

The use of different input transducers, or a common input transducer with distinct coupling to each outut tranducer, enables each channel to have a different insertion loss. This permits the aperture width of each channel to be a best compromise to achieve fine adjustment of that channel's insertion loss while maintaining a close match between the channel's output impedance and that of the other channels.

Furthermore, when using separate input transducer sections for each channel, or a combined input transducer with distinct coupling characteristics to each channel, it is also possible to employ different interdigital spacings for each distinct input transducer section.

This enables the center frequency of the input transducer of each channel to be independently selected.

The circuit designer can then choose a different center frequency for use with each output transducer. That, in turn, permits the choice of a different optimal center frequency for each channel, instead of forcing the designer to accept a single compromise center frequency for all channels. The use of an optimal center frequency for each SAW channel keeps the overall insertion loss level to a minimum, improving the quality of reception in a subscription TV system.

DETAILED DESCRIPTION OF THE PREFERRED EMBODIMENTS

Figure 1:
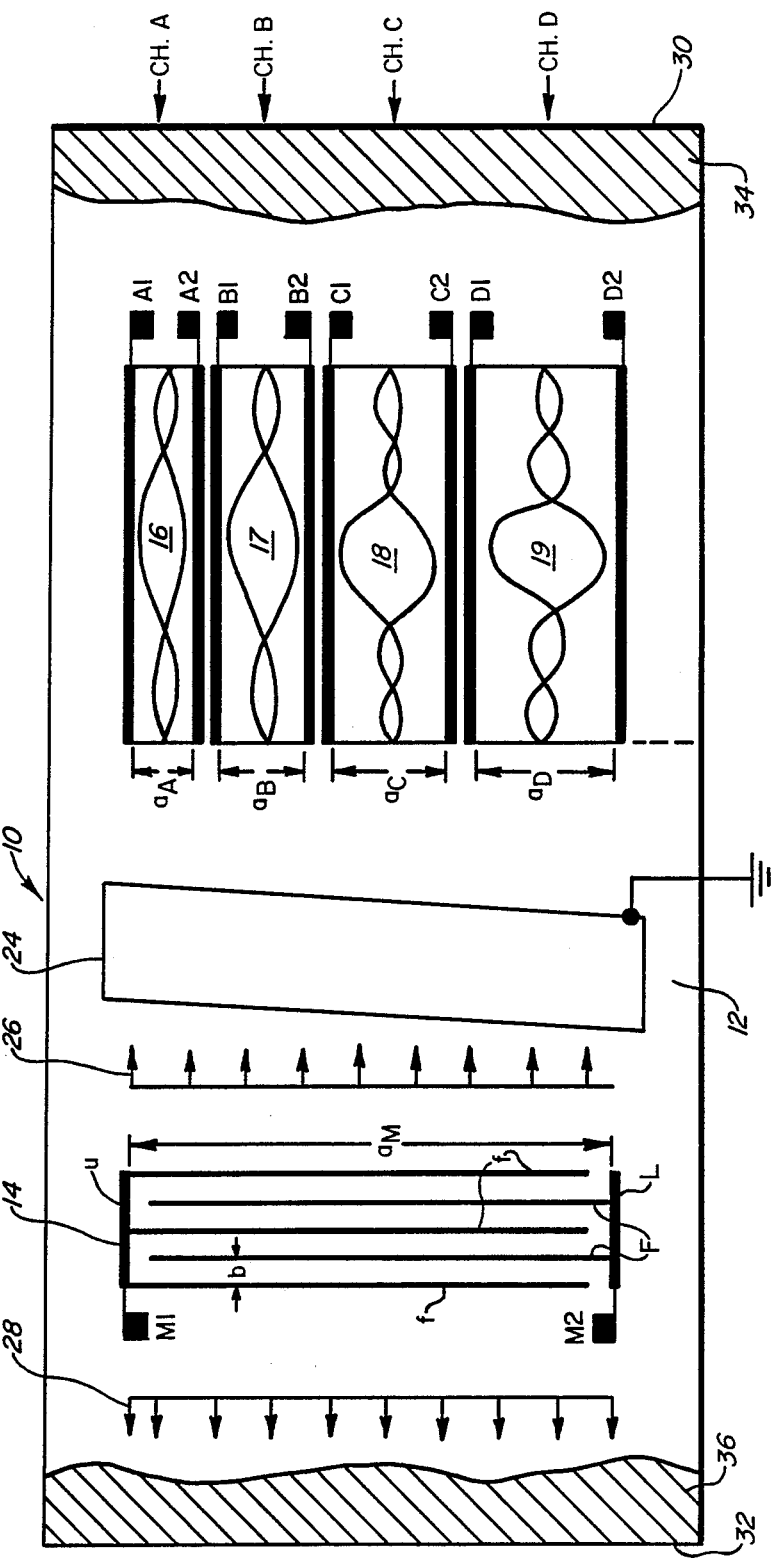
FIG. 1 is a schematic top plan view of a multi-channel SAW device.

FIG. 1 shows a multi-channel SAW encoder/decoder 10 for coupling a common input to a plurality of SAW channels in a subscription TV receiver. The encoder/decoder is formed on the surface of a piezoelectric substrate 12. A uniform interdigital type SAW input transducer 14, having terminal pads M1 and M2 acting as electrical input terminals, is printed on the substrate surface. Terminal pad M1 is connected to an upper bus bar U, from which electrode fingers f protrude downward. Terminal pad M2 is connected to a lower bus bar L, from which electrode fingers F protrude upward between fingers f. An electrical signal applied to terminals M1, M2 causes input transducer 14 to launch two surface acoustic waves on the substrate surface, a forward wave 26 and a backward wave 28.

It is known that the surface acoustic waves so generated will have a center frequency with a half wavelength equal to the center to center spacing b of adjacent "active" fingers, also called the "interdigital spacing." A finger f (or F) lying parallel and adjacent to at least a portion of an oppositely electrically poled finger F (or f) is referred to as "active." All the fingers f and F of uniform input transducer 14 are active.

Both waves launched by transducer 14 have the width of the aperture $a_M$ of the uniform transducer, and propagate away from it as shown by the arrows 26 and 28. The forward acoustic signal wave 26 generated by transducer 14 propagates toward four output transducers 16, 17, 18, and 19. These respond by generating electric signals across corresponding pairs of terminal pads A1-A2, B1-B2, C1-C2, and D1-D2. An acoustical absorber 34 is provided to absorb the forward wave 26 after it passes the receiving transducers, preventing any unwanted reflection of the forward wave from the substrate's forward edge 30.

The backward wave 28 generated by transducer 14 is not used, and an acoustical absorber 36 is provided to prevent its reflection from the substrate edge 32. Also, a grounded conductive shield 24 is provided on the substrate between the input transducer 14 and the output transducers 16-19 to reduce capacitive coupling between their respective electrode structures.

The output transducers 16-19 have respective characteristic frequency response curves suitable for their respective channels, by virtue of their respective apodization envelopes, i.e. their multi-lobed finger overlap patterns schematically illustrated in the drawing, as is well understood in the SAW art.

It is known that the output impedance of any of the output transducers 16-19 is inversely proportional to its respective aperture $a_A$–$a_D$. The proportionality factor depends on the frequency response of the output transducer, which may be different for each channel. However, in the coding/decoding applications considered here, the frequency responses of the various output transducers are close enough so that, to a good approximation, sufficiently close output impedance matching is obtained when transducers 16-19 all have the *same* aperture width $a_A = a_B = a_C = a_D$.

However, substantial differences in output signal levels at terminals A1-A2, B1-B2, C1-C2 and D1-D2 are also needed. These differences in signal levels are obtained by corresponding differences between the insertion losses for each channel.

It is known, however, that each SAW channel will have an insertion loss that is approximately inversely proportional to the aperture $a_A$, $a_B$, $a_C$, $a_D$, of the apodized transducer for that channel. For example, channel A will have an insertion loss inversely proportional to the aperture width $a_A$ of transducer 16, and so on. Therefore, specifying predetermined relative differences in insertion losses among the channels normally requires their receiving transducers to have *different aperture widths*.

As a consequence, the encoder/decoder filter of FIG. 1 has the serious design limitation that prescribing closely matched output impedances for channels A through D rules out the possibility of simultaneously having different insertion losses for each channel.

Figure 2:
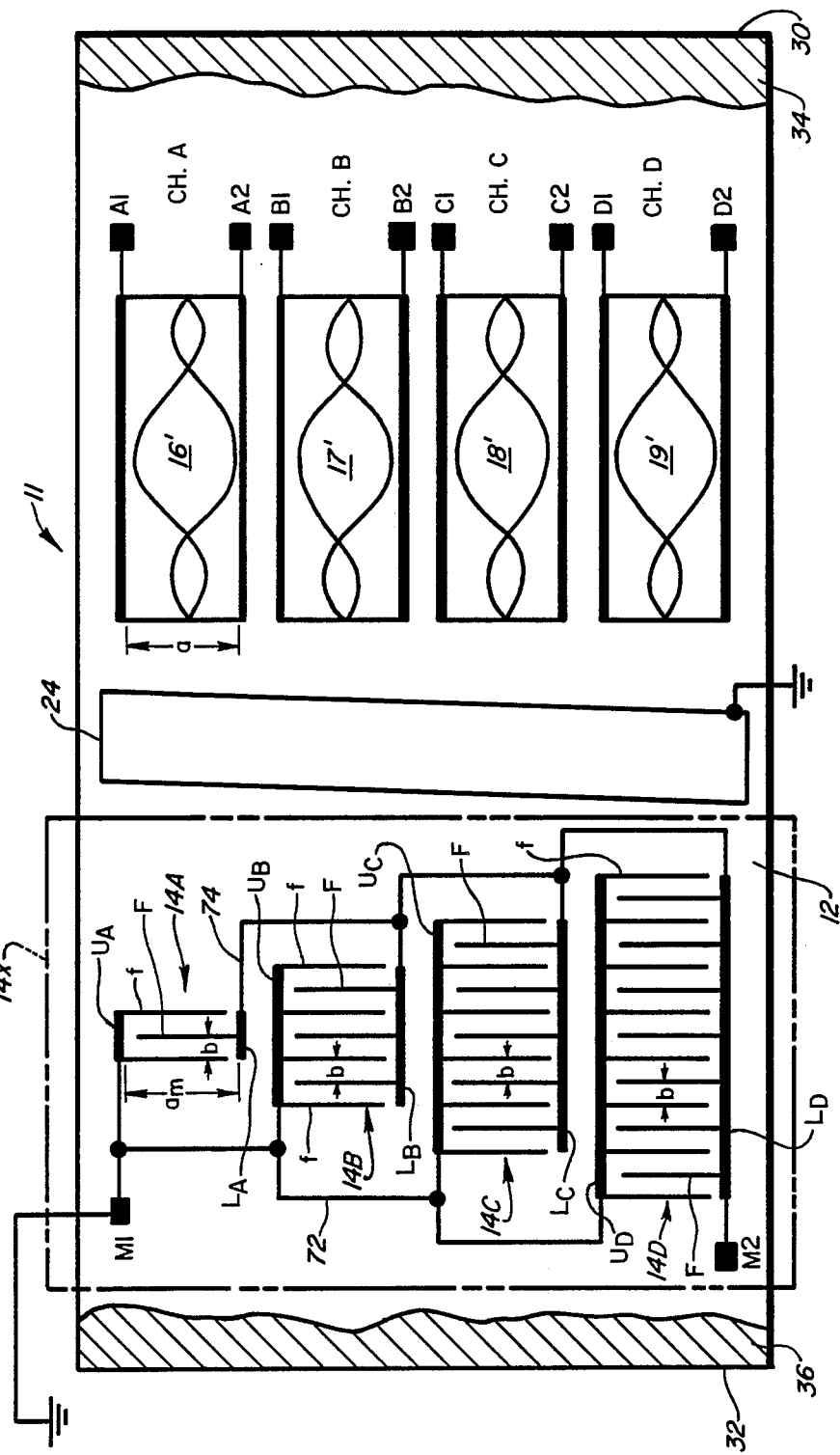
FIG. 2 is a similar view of a multi-channel SAW device which, is similar in purpose to that of FIG. 1, but which is constructed in accordance with the teachings of this invention.

FIG. 2 shows a simplified top plan view of a first embodiment of an inventive multi-channel SAW encoder/decoder 11 which is in all respects similar to device 10 except that a novel transducer stack 14x composed of four uniform transducers 14A, 14B, 14C, and 14D is substituted for the single uniform transducer 14 of FIG. 1. To share a common input, these transducers are electrically connected in parallel by leads 72 and 74. The upper bus bars $U_A$ through $U_D$ of each transducer are interconnected by lead 72, and their lower bus bars $L_A$ through $L_D$ are interconnected by lead 74.

The transducers $14_A$–$14_D$ of the embodiment of FIG. 2 are shown as having the same interdigital spacing b and aperture $a_m$, but the number of finger overlaps between their respective top fingers f and their respective bottom fingers F are different.

This difference in the number of fingers, and hence of finger overlaps, among transducers 14A-D results in a corresponding difference in their acoustic output signal amplitudes. Thus the acoustic signal strength varies among channels A through D, and thereby provides a means for varying the insertion losses of the individual SAW channels. This enables the SAW encoder/decoder of this invention to achieve the different insertion losses for each channel required by the encoding/decoding application, and at the same time maintains a close match between the impedances of the output transducers. This impedance match prevents visible distortion of the TV picture as the alternative channels are switched in and out in the course of subscription TV encoding/decoding operation.

Thus, the respective numbers of fingers in transducers 14A–14D are chosen to reflect the required insertion loss differentials between channels, enabling each channel's insertion loss to be selected substantially independently of the output impedance of its output transducer. In particular, it permits output transducers 16'–19' all to have matched output impedances, without sacrificing the required differences in the insertion losses between the channels A through D.

The surface acoustic waves generated by the transducer stack 14x will differ from those generated by transducer 14 of FIG. 1 in that there will be four separate forward signal waves traveling in different tracks across substrate 12 toward their respective output transducers 16'–19'.

FIG. 2 may be modified so that the interdigital distance b between the fingers f, F is not the same for each of the uniform transducers 14A, 14B, 14C, 14D. It can be independently chosen for each transducer to fit the design of the individual channels. Adjusting the interdigital dimension b enables the center frequency of each channel to be chosen individually, which has significant advantages for reasons which will be discussed further below.

Figure 3:
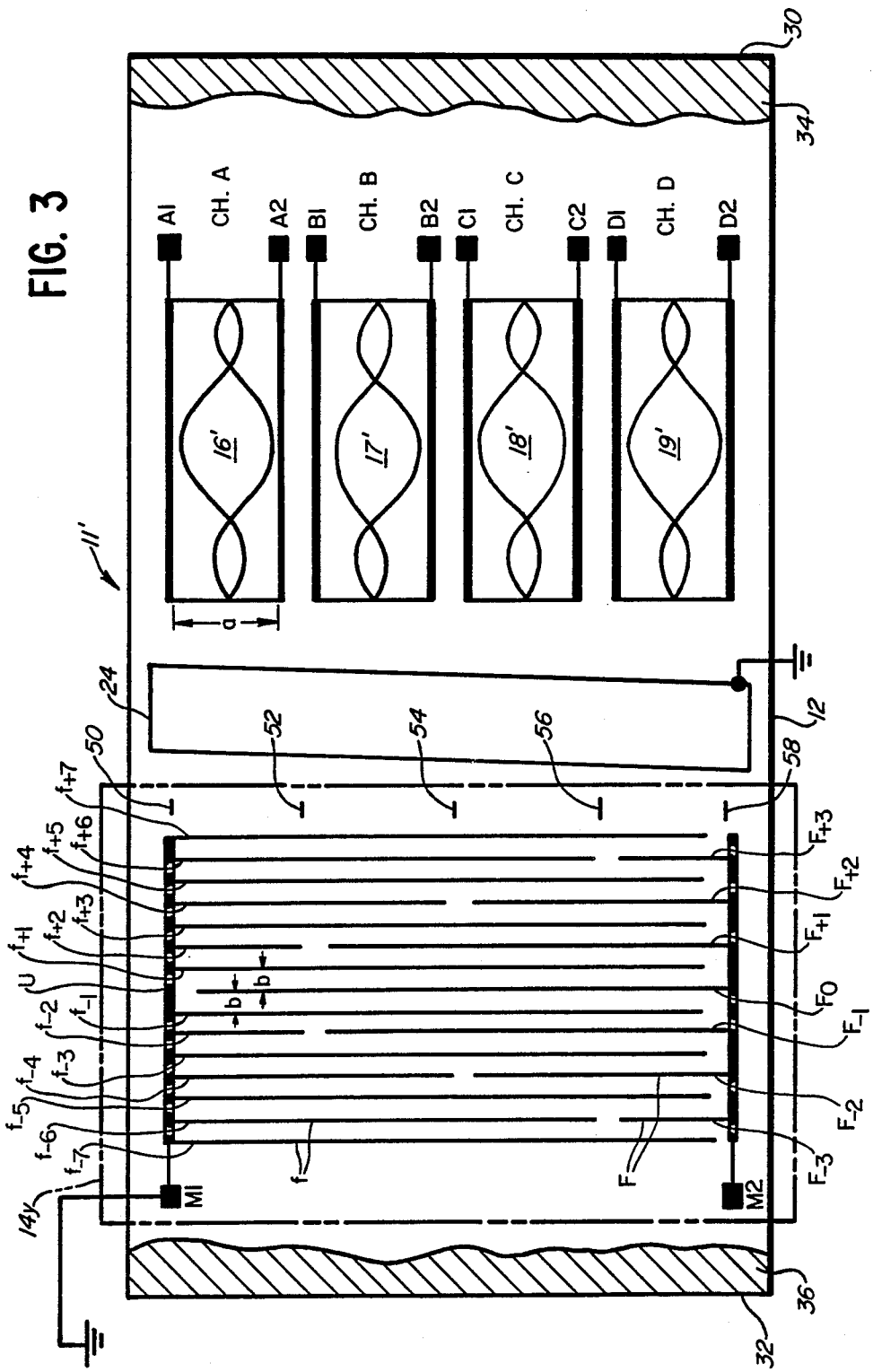
FIG. 3 is a schematic top plan view of an alternative embodiment of a multi-channel SAW device in accordance with this invention.

FIG. 3 shows an alternative encoder/decoder 11' which is similar to the encoder/decoder 11 of FIG. 2, but incorporates an inventive single interdigital SAW transducer 14y that can be substituted for the transducer stack 14x. It represents another way of varying the acoustic output signal strength among channels A–D, but is a simpler structure since it has only one set of bus bars U, L and does not require the leads 72 and 74 needed in FIG. 2 to connect the pairs of bus bars $U_A$-$L_A$, $U_B$-$L_B$, $U_C$-$L_C$, $U_D$-$L_D$ of the transducers 14A, 14B, 14C, 14D.

The transducer 14y has upper and lower bus bars U, L to which the fingers (f, F) of its upper and lower combs are respectively attached at a regular interdigital spacing b. The fingers f of the upper bus bar U include both active fingers ($f_{-7}$, $f_{-5}$, $f_{-3}$, $f_{-1}$, $f_{+1}$, $f_{+3}$, $f_{+5}$, $f_{+7}$) and inactive "filler" fingers ($f_{-6}$, $f_{-4}$, $f_{-2}$, $f_{+2}$, $f_{+4}$, $f_{+6}$) to maintain a uniform surface acoustic wave velocity in the transducer. All the fingers ($F_{-3}$, $F_{-2}$, $F_{-1}$, $F_0$, $F_{+1}$, $F_{+2}$, $F_{+3}$) of the lower bus bar L, however, are active substantially along their entire lengths.

The active fingers $f_{-7}$, $f_{-5}$ ... $f_{+5}$, $f_{+7}$ of the upper bus bar U are interspersed with the fingers $F_{-3}$, $F_{-2}$ ... $F_{+2}$, $F_{+3}$ (all active) of the lower bus bar L. The latter fingers are of nonuniform length; while the upper active group $f_{-7}$, $f_{-5}$ ... $f_{+5}$, $f_{+7}$ are of length, extending across nearly the entire aperture of transducer 14y. The lengths of the non-uniform finger set increase from short finger $F_{-3}$ to long finger $F_0$, and also from short finger $F_{+3}$ to long finger $F_0$. Consequently, finger $F_0$ is the only lower finger which is long enough to overlap with any fingers of the upper bus bar U within the portion of the transducer aperture bounded by lines 50 and 52; fingers $F_{-1}$, $F_0$ and $F_{+1}$ are the only lower fingers long enough to overlap with any of the fingers of the upper bus bar U within the portion of the transducer aperture bounded by lines 52 and 54; and fingers $F_{-2}$, $F_{-1}$, $F_0$, $F_{+1}$ and $F_{+2}$ are the only lower fingers long enough to overlap with any of the fingers of the upper bus bar U within the portion of the transducer aperture bounded by lines 54 and 56; while all of the lower fingers $F_{-3}$ through $F_{+3}$ are long enough to overlap with the upper bus bar fingers in the area bounded by lines 56 and 58. As a result, the number of finger overlaps increases monotonically, from a minimum in subaperture 50–52, to a larger number in subaperture 52–54, a still larger number in subaperture 54–56, and the largest number in subaperture 56, 58.

Subaperture 50–52 corresponds to Channel A; i.e. it is the only portion of transducer 14y which is acoustically coupled to output transducer 16'. This is because subaperture 50–52, like input transducer 14A of FIG. 2, to which it is analogous, is oriented to transmit its highly directional acoustic beam in the direction of output transducer 16'. Similarly, subaperture 52–54 corresponds to Channel B because it is acoustically coupled to output transducer 17', subaperture 54–56 corresponds to Channel C because it is acoustically coupled to output transducer 18', and subaperture 56–58 corresponds to Channel D because it is acoustically coupled to output transducer 19'. This means that the number of active finger overlaps in the input transducer 14y increases monotonically from Channel A to Channel D, and consequently the strength of the acoustic signal it produces also increases monotonically from Channel A to Channel D, or from the upper bus bar U to the lower bus bar L.

Connecting the upper bus bar U of transducer 14y to ground will reduce any electrical crosstalk between the input transducer and the individual channel output transducers. This crosstalk reduction arises from the shielding effect of having groups of grounded fingers at both the left ($f_{-7}$, $f_{-6}$, $f_{-5}$) and right ($f_{+5}$, $f_{+6}$, $f_{+7}$) sides of the structure 14y.

Figure 3A:
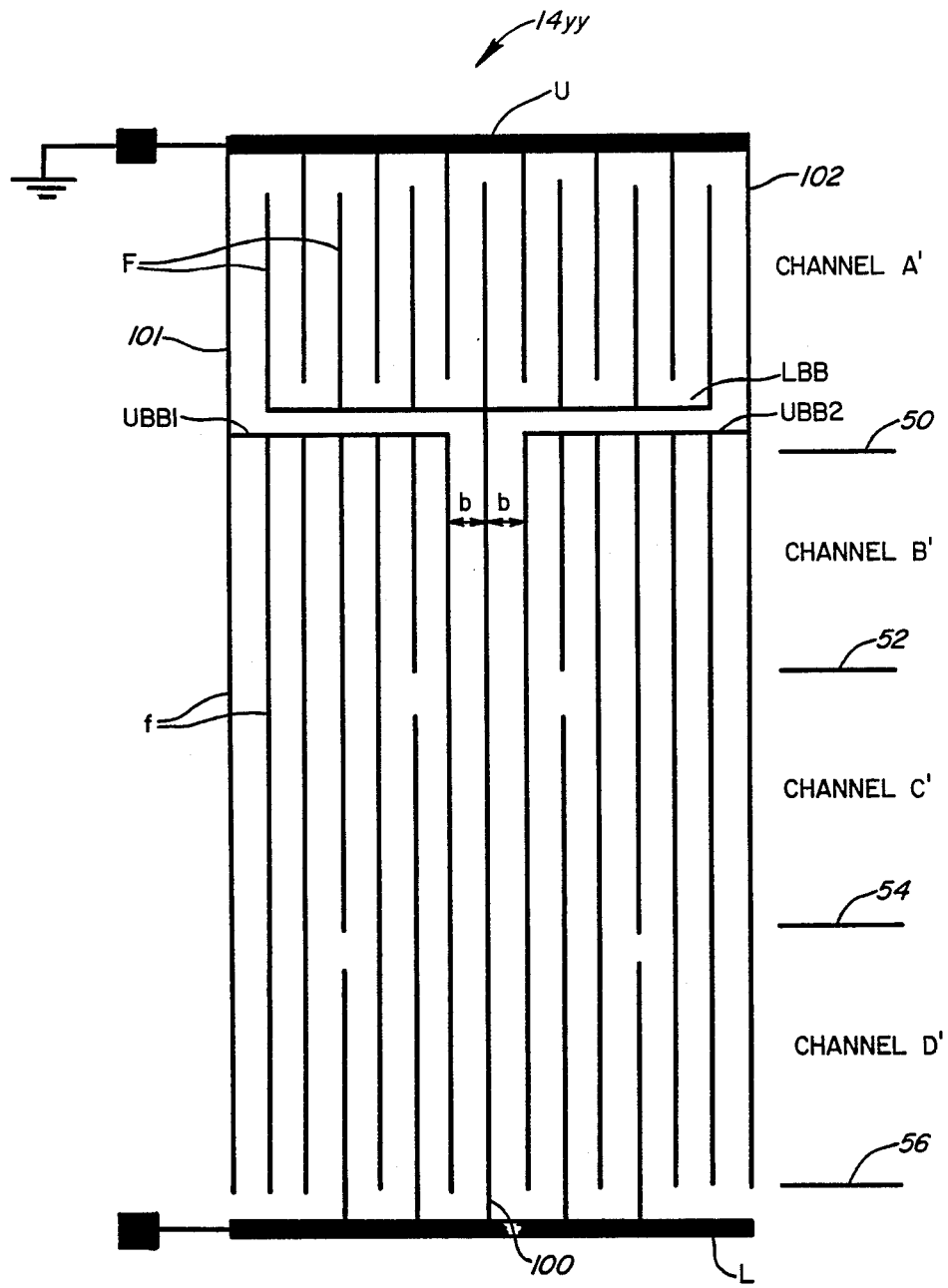
FIG. 3A is a schematic drawing an alternative embodiment of a composite input transducer.

Other embodiments of the composite input transducer can be substituted for transducer 14y of FIG. 3 when it is not desired that the strength of the acoustic signal increase monotonically from the channel nearest the upper bus bar U to the channel nearest the lower bus bar L. For example, FIG. 3A shows an embodiment of a composite input transducer 14yy which produces its strongest acoustic signal in channel A' nearest upper bus bar U. Continuing across the transcuder, the acoustic signal falls to its weakest in channel B' and then increases somewhat in channel C'. It reaches its second greatest strength in channel D', nearest lower bus bar L. To produce this effect, the number of finger overlaps increases in the channel order B', C', D', A'. In this more complicated transducer, channel A' has its own local lower bus bar LBB, connected to the composite transducer's lower bus bar L via finger 100. Likewise, channels B', C' and D' have common local upper bus bars UBB1 and UBB2, respectively connected to the composite transducer's upper bus bar U by fingers 101 and 102.

Figure 4:
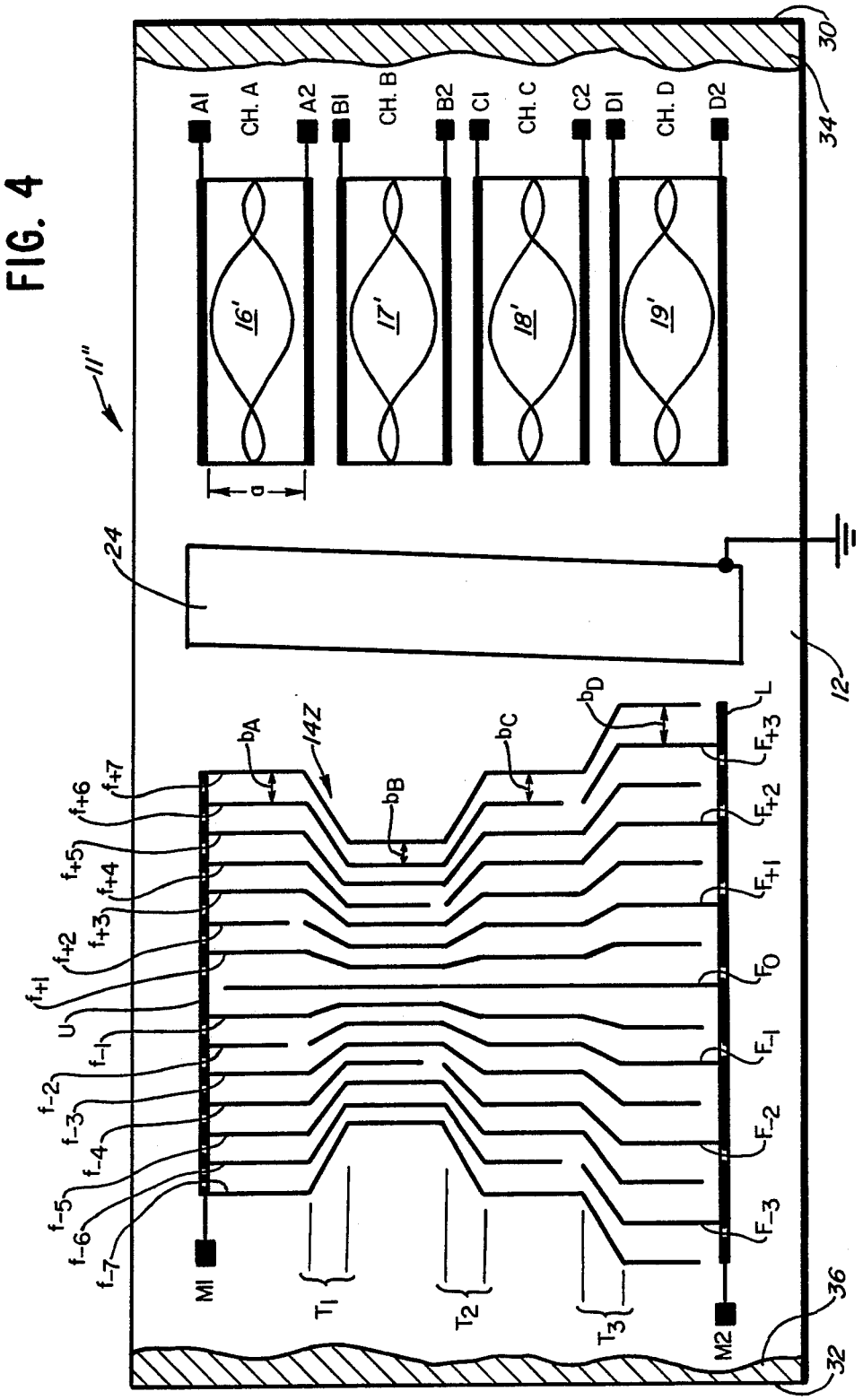
FIG. 4 is a schematic top plan view of another alternative embodiment of a multi-channel SAW device in accordance with this invention.

FIG. 4 shows another encoder/decoder 11" incorporating an inventive input transducer 14z which is a modification of transducer 14y of FIG. 3. The two are similar except that the transducer 14z has different interdigital spacings ($b_A$, $b_B$, $b_C$, $b_D$) for each of the individual subapertures of channels A through D. This enables each subtransducer to have a center frequency individually selected for best performance of its own channel. The resulting transducer 14z has finger spacing transition regions ($T_1$, $T_2$, $T_3$) containing slanted finger segments which provide connections between the fingers of the individual subtransducers. For a comparison with a prior art multichannel transducer that also uses slanted transition segments, see FIGS. 5 and 6 of U.S. Pat. No. 4,379,274 (Hansen).

Figure 4A:
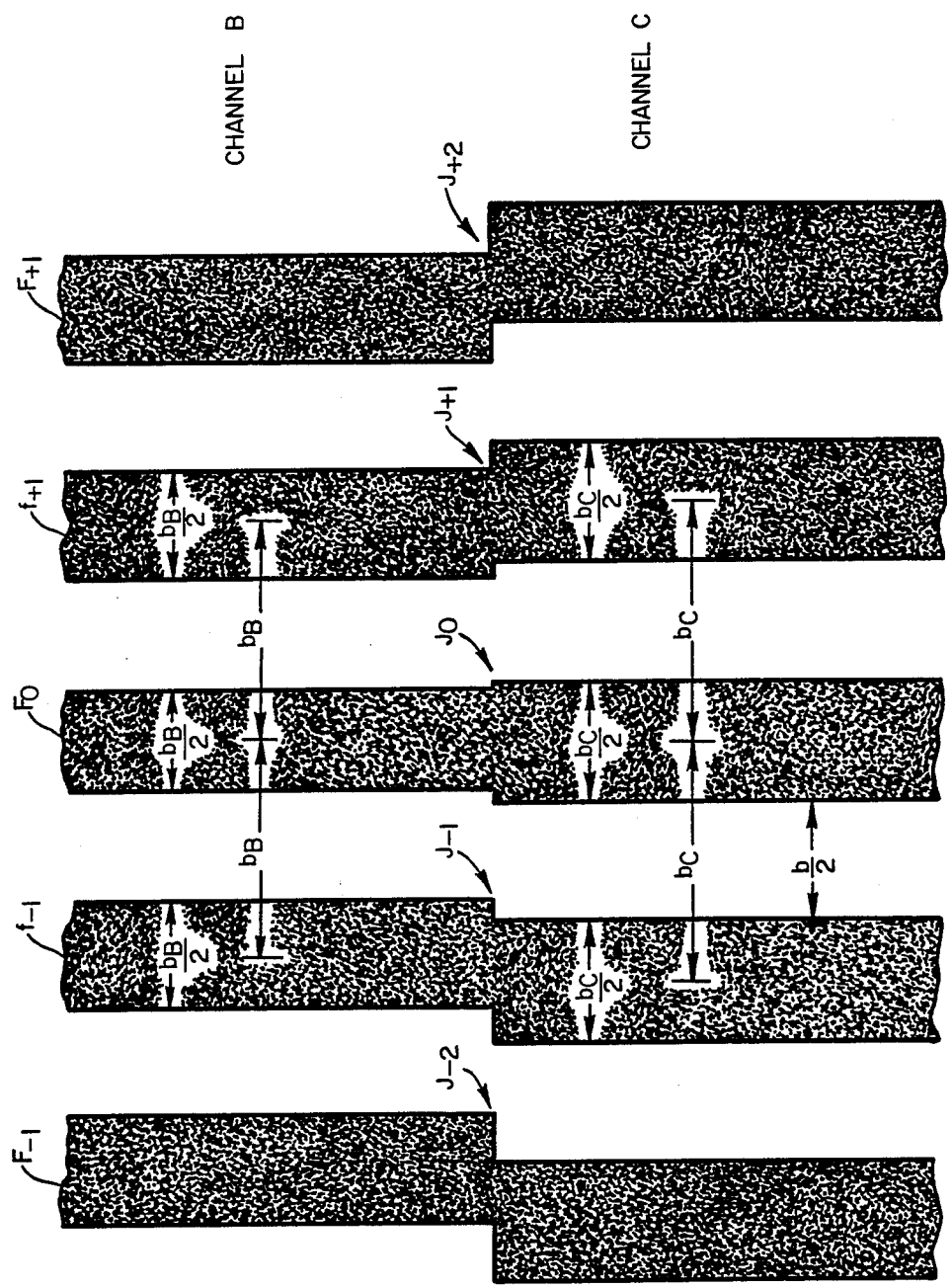
FIG. 4A is an enlarged partial plan view of some of the electrode fingers of a further alternative composite input transducer near a boundary between channels.

When the center frequencies of adjacent channels do not differ by much, the transition regions of slanted segments may be entirely avoided, thus saving substrate material. FIG. 4A shows an enlargement of some of the fingers of a composite input transducer having such construction at the boundary between channels B and C. The effect of the different interdigital spacing ($b_B \neq b_C$) between the fingers of the channels B and C can be absorbed because of the different widths ($b_B/2 \neq b_C/2$) of the fingers of each channel. In the embodiment shown, in each channel the interdigital spacing is a half wavelength, and the fingers have a width of a quarter wavelength, of the channel's respective center frequency. The fingers from the upper channel are offset from the fingers from the lower channel, but join up with them at junctions . . . $J_{-2}$, $J_{-1}$, $J_0$, $J_{+1}$, $J_{+2}$ . . . , thus providing electrical contact between the corresponding fingers of each set.

Figure 4B:
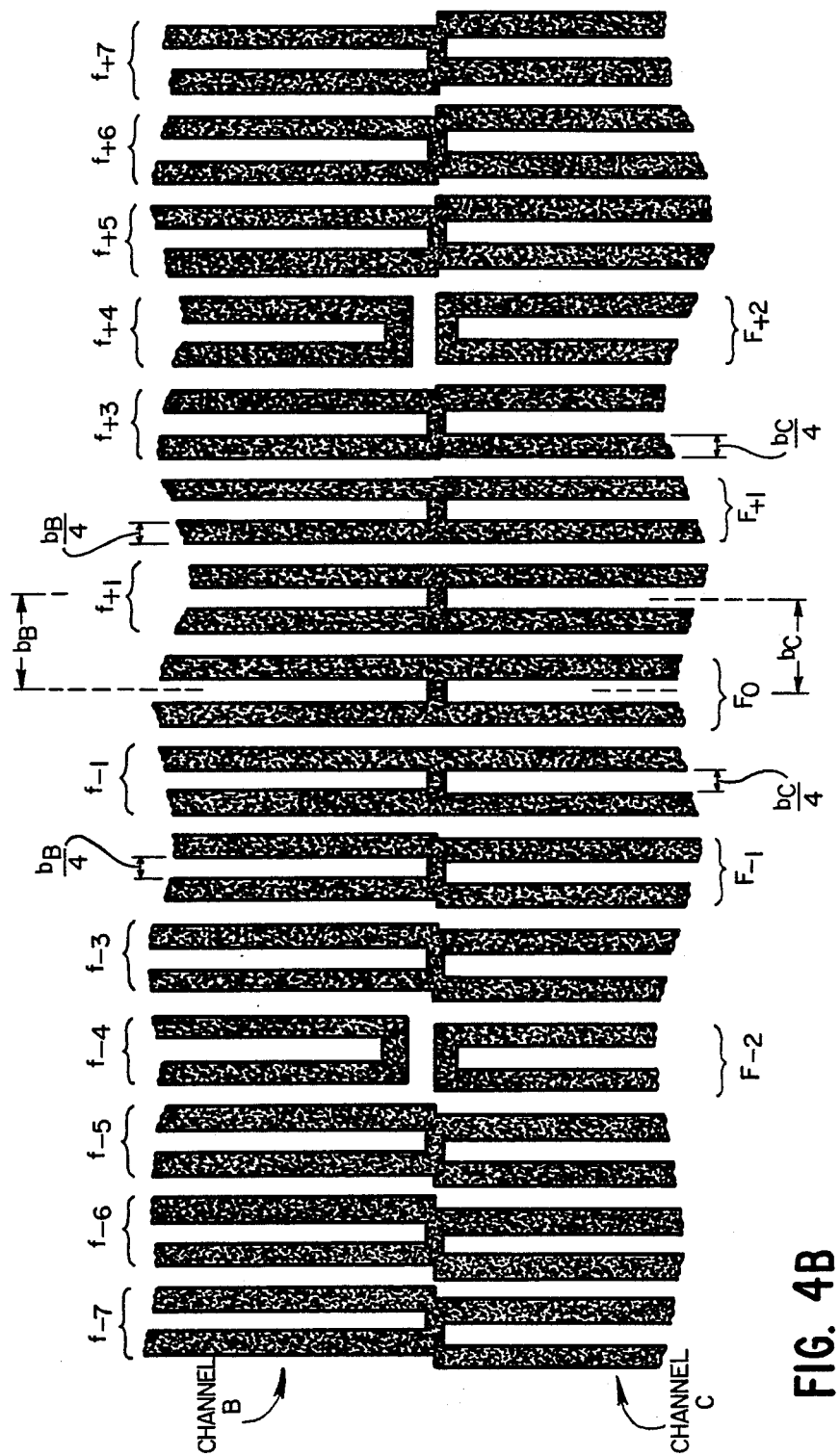
FIG. 4B is an enlarged plan view of the loop-shaped electrode fingers of yet another alternative composite input transducer near a boundary between channels.

The embodiment of FIG. 4A employs solid-strip, half-wavelength-width fingers. To reduce acoustic reflections it may be advantageous to use split fingers each formed of two spaced one-eighth-wavelength-width strips. Thus FIG. 4B shows an enlargement of the split fingers of yet another composite input transducer in which the boundary between adjacent channels B and C is formed without slanted transition segments. Here again, compare FIGS. 5 and 6 of Hansen U.S. Pat. No. 4,379,274, which also employs split fingers In the embodiment of FIG. 4B of the present invention, in each channel the interdigital spacing is a half-wavelength, and each split finger is formed from a pair of individual parallel electrode strips, each having a width of an eighth of a wavelength. The space between the individual strips forming each finger also has a width of an eighth of a wavelength. Some fingers from each upper channel join up with fingers from a lower channel at their ends, thus providing electrical contact between the fingers of each set. Fingers ($f_{-4}$, $f_{+4}$) that do not join up with those of another channel are spaced by a gap from opposing fingers ($F_{-3}$, $F_{+3}$) of the other channel.

Prior art input transducer designs can only have a single compromise center frequency, chosen to provide the best overall performance for the multichannel encoder/decoder 10 as a whole. A single center frequency cannot be optimal for all channels.

In contrast, the input transducer stack 14x of FIG. 2, the transducer 14z of FIG. 4, and the embodiments of FIGS. 4A and 4B, can all use different interdigital spacings ($b_A$, $b_B$, $b_C$, $b_D$) for the individual transducers 14A-D or the subtransducers of channels A-D, enabling the center frequency of each input transducer or subtransducer to be selected to equal the optimum center frequency of its respective channel.

The particular application of this SAW device as an encoder or decoder requires insertion loss differences between the individual channels. The channel with the least insertion loss fixes the insertion losses for the other channels, and must have the lowest possible insertion loss for best system performance. The selection of the optimum center frequency for this channel insures minimum insertion loss. As a result of the freedom to choose different center frequencies for the uniform transducer sections of the different channels, the apodized transducers are simpler and easier to construct.

The composite transducer structures 14y and 14z of FIGS. 3 and 4 are preferable to the stacked transducer structure 14x of FIG. 2, since the composite structures 14y and 14z do not have to provide parallel electrical connections between the individual transducers 14A-D. These connections are an inherent part of the composite structure 14y or z.

Another advantage is that the composite structures 14y and z each have a total of only one pair of bus bars, whereas the stacked structure 14x has one bus bar pair per transducer, or a total of four pairs. It has been our experience that multiple bus bar pairs impair the frequency response of the encoder/decoder 11 on the upper slope of its passband and in the rejection band as well. It is believed that the bus bars act as waveguides and thus form a multitude of wave modes in the acoustic beam. The higher order wave modes can distort the frequency responses of the SAW channels in undesirable and uncontrollable ways.

In carrying out the design of encoder/decoders according to this invention, there is a practical limit to the number of finger overlaps that can be used in the input transducers. A uniform transducer's frequency bandwidth is known to be inversely proportional to the number of its finger overlaps, so the maximum number of finger overlaps for the input transducer is fixed for each channel A-D by the desired bandwidth.

Furthermore, only an integral number of finger overlaps can be used, which makes the channel insertion losses adjustable only in quantized steps. However, in practice, fine adjustment of insertion losses can be made by slight modifications to the apertures of the apodized receiving transducers 16'-19'. Although an apodized transducer's output impedance depends on its aperture, the impedance is relatively insensitive to slight aperture modifications.

While the principles of the invention have been described above in connection with specific apparatus and applications, it is to be understood that this description is intended only by way of example and not as a limitation on the scope of the invention. Therefore, the following claims are to be construed to cover all equivalent structures.

The invention claimed is:

1. A multichannel SAW device comprising:
   a common SAW input transducer means;
   a plurality of SAW output transducers, each acoustically coupled to said input transducer means and having a preselected electrical output impedance;
   and transmission means acoustically coupling said input transducer means to each of said output transducers, and having substantially equal acoustic losses with respect to each of said output transducers;
   each of said output transducers cooperating with said common input transducer means to form a respective SAW channel;
   and said input transducer means being so arranged that it delivers a stronger acoustic signal to one of said output transducers than to another, whereby the insertion losses of said channels are not in the same proportion to each other as the output impedances of their output transducers are to each other.

2. The filter of claim 1 wherein the output impedances of said output transducers are substantially matched, yet the insertion loss of at least one said channel is substantially different from another said channel.

3. The device of claim 1 wherein said input transducer means includes means for producing substantially different acoustic output amplitudes across the aperture thereof in response to a single electrical input signal.

4. The device of claim 1 wherein said input transducer means comprises a plurality of individual transducers or substransducers connected electrically in parallel, each individual transducer or subtransducer being positioned ot couple acoustically to a respective one of siad output transducers.

5. The device of claim 4 wherein different ones of said individual transducers or subtransducers comprise different numbers of active finger pairs.

6. The device of claim 5 wherein the transducers or subtransducers are interdigital transducers having interdigitated electrode fingers with respective different finger spacings for said different channels, and having electrically conducting slanted transition segments forming connections between the differently spaced fingers of adjacent channels.

7. The device of claim 5 wherein the transducers or subtransducers are interdigital transducers having interdigitated electrode fingers with respective different finger spacings for said different channels, the ends of preselected fingers joining to electrically connect adjacent channels in parallel but being offset to accommodate the different finger spacings.

8. A multi-channel surface acoustic wave device comprising:
a plurality of interdigital surface acoustic wave transmitters having a common electrical input;
and a plurality of surface acoustic-- wave receivers acoustically coupled to respective ones of said transmitters to define respective channels;
said transmitters having respective different numbers of finger overlaps, whereby the insertion losses of respective channels can be chosen substantially independently of their respective output impedances.

9. Apparatus as in claim 8 wherein said transmitters are combined so as to share a common pair of bus bars.

10. Apparatus as in claim 8 wherein said transmitters have respective different finger spacings whereby to operate a respective different center frequencies.

11. The device of claim 10 wherein the transmitters of different channels have fingers with respective different finger spacings to achieve different center frequencies, and comprising electrically conducting transition segments slanted relative to said fingers which form electrical connections between the differently spaced fingers of adjacent channels.

12. The device of claim 10 wherein the transmitters of different channels have fingers at respective different finger spacings tc achieve different center frequencies, the ends of preselected fingers joining to electrically connect adjacent channels in parallel but being offset to accommodate the different finger spacings.

13. A multichannel SAW device comprising a plurality of acoustic receivers, acoustic transmitter means acoustically coupled to said acoustic receivers and coupled to an electrical drive signal, and transmission means acoustically coupling said transmitter means to said receivers, and having substantially equal acoustic losses with respect to each of said receivers, said transmitter means being arranged to deliver a stronger acoustic signal to one of said receivers than to another.

14. A device as in claim 13 wherein said transmitter means is divided into individual transmitters each acoustically coupled to a different one of said receivers and delivering a different acoustic signal strength thereto.

15. A device as in claim 14 wherein at least two of said individual transmitters comprise interdigitated fingers arranged to operate at different center frequencies.

16. A device as in claim 15 further comprising transition segments slanted relative to said fingers and electrically connecting said fingers of adjacent transmitter means.

17. A device as in claim 15 wherein preselected fingers are joined at their ends to electrically connect adjacent channels in parallel but are offset to accommodate the different finger spacings.

18. A device as in claim 14 wherein at least twc of said individual transmitters comprise interdigitated fingers all connected to a common pair of bus bars.

19. A device as in claim 14 wherein at least two of said individual transmitters comprise interdigitated fingers arranged to operate at different center frequencies and all connected to a common pair of bus bars.

* * * * *